(12) United States Patent
Kawai

(10) Patent No.: US 7,005,950 B2
(45) Date of Patent: Feb. 28, 2006

(54) NEGATIVE IMPEDANCE CONVERTER

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 32 days.

(21) Appl. No.: 10/842,020

(22) Filed: May 7, 2004

(65) Prior Publication Data

US 2004/0222871 A1  Nov. 11, 2004

(30) Foreign Application Priority Data

May 9, 2000 (JP) ............................... 2003-131188

(51) Int. Cl.
*H03H 11/52* (2006.01)
*H03H 11/44* (2006.01)

(52) U.S. Cl. .................. 333/216; 333/213; 330/85
(58) Field of Classification Search ........ 333/213–217; 330/85

See application file for complete search history.

(56) References Cited

U.S. PATENT DOCUMENTS 4,350,964 A * 9/1982 Chambers, Jr. ............. 333/213

OTHER PUBLICATIONS

"Realization of gyrators using operational amplifiers, and their use in RC-active-network synthesis", A. Antoniou, PROC. IEE, vol. 116, No. 11, Nov., 1969, pp. 1838-1850 (13 sheets).

* cited by examiner

Primary Examiner—Stephen E. Jones
(74) Attorney, Agent, or Firm—Flynn, Thiel, Boutell & Tanis, P.C.

(57) ABSTRACT

There is provided a negative impedance converter, which has negative impedance conversion function by widening the available range of a generalized impedance converter. A generalized impedance converter is composed of two operational amplifiers $Q_1$ and $Q_2$ and four series-connected first to fifth impedance elements $Z_1$ to $Z_4$. The four impedance elements included in the generalized impedance converter are all set as the same resistor R1, and an impedance element $Z_6$ is connected between the intermediate point B of the series-connected impedance elements and the ground. The magnitude of the impedance element $Z_6$ is set smaller than that of load impedance element $Z_5$. By doing so, the input impedance $Z_{11'}$ becomes negative, and the kind of the impedance is determined depending on the kind of the impedance elements $Z_5$ and $Z_6$.

4 Claims, 3 Drawing Sheets

NEGATIVE IMPEDANCE CONVERTER

BACKGROUND OF THE INVENTION

1. Field of the Invention

The present invention relates to a negative impedance converter, which can make a desired kind of negative impedance conversion by widening the available range of a generalized impedance converter.

2. Description of the Related Art

An impedance converter makes conversion between different impedances in addition to the same impedances. A generalized impedance converter is given as the conventional impedance converter. (For example, see A. Antoniou, "Realization of Gyrators Using Operational Amplifiers, and Their Use in RC Active Network Synthesis", Proc. IEE, vol. 116, pp. 1838–1850, 1969) The generalized impedance converter comprises a circuit ZIC combining two operational amplifiers $Q_1$, $Q_2$ and four impedance elements $Z_1$ to $Z_4$, as seen from the dashed line frame in FIG. 6. The input impedance $Z_{11'}$ to convert the negative impedance $Z_5$ is expressed by the following equation (1).

$$Z_{11} = \frac{Z_1 Z_3}{Z_2 Z_4} Z_5 \qquad (1)$$

More specifically, various impedance elements are used as four impedance elements $Z_1$ to $Z_4$. By doing so, the foregoing generalized impedance converter ZIC can make various impedances proportional to the magnitude of the negative impedance $Z_5$. For example, when the impedance element $Z_4$ is set as capacitor, the impedance is $1/sC_4$. Further, when impedance elements $Z_1$ to $Z_3$ are individually set as the same resistor R1, and the negative impedance $Z_5$ is set as resistor $R_2$, the input impedance $Z_{11'}$ is expressed by the following equation (2).

$$Z_{11'} = sR_1R_2C_4 \qquad (2)$$

Therefore, inductor is equivalently obtained.

In addition, when impedance elements $Z_1$ and $Z_5$ are set as capacitors $C_1$ and $C_5$, respectively, the impedance is $1/sC_1$, $1/Cs_5$; in this case, the input impedance $Z_{11'}$ is expressed by the following equation (3).

$$Z_{11'} = \frac{1}{s^2 R_1 C_1 C_5} \qquad (3)$$

If $s = j\omega$ ($\omega = 2\pi f$), the following equation (4) is obtained.

$$Z_{11'}(j\omega) = \frac{-1}{R_1 C_1 C_5 \omega^2} \qquad (4)$$

The polarity of the input impedance $Z_{11'}$ is negative; therefore, a negative resistor called frequency-dependent negative resistor (FDNR) is obtained. In this case, the frequency-dependent negative resistor (FDNR) has property inversely proportional to $\omega^2$, that is, frequency f. Thus, the frequency-dependent negative resistor (FDNR) is applicable as a new ladder-type filter.

As described above, the conventional generalized impedance converter can make mutual conversion between different impedance as capacitor and inductor, and negative resistor inversely proportional to $\omega^2$.

However, the conventional generalized impedance converter cannot make negative capacitor and negative inductor.

The present invention has been made in view of the foregoing circumstances. It is, therefore, an object of the present invention to provide a negative impedance converter, which readily can obtain negative capacitor and negative inductor in addition to negative resistor by widening the available range using a generalized impedance converter circuit.

SUMMARY OF THE INVENTION

According to one aspect of the present invention, there is provided a negative impedance converter comprising: four series-connected first to fifth impedance elements; and two operational amplifier circuits having input and output connected to form negative feedback loop with respect to the first to fourth impedance elements, a sixth impedance element being connected between the central connection point of the first to fourth impedance elements and two operational amplifier circuits and the ground, a value of the sixth impedance element being set smaller than a value of a fifth impedance element so that the input impedance becomes negative, the fifth impedance element functioning as a load connected to the termination of the first to fourth impedance elements.

The negative impedance converter of the present invention has the following configurations.

(1) The first to sixth impedance elements are all resistors and the value of the first to fourth resistance values are set to the same, and thereby, the input impedance becomes negative resistance.

(2) The first to fourth impedance elements are all resistor having the same resistance value and the fifth and sixth impedance elements are set as inductor, and thereby, the input impedance becomes negative inductance.

(3) The first to fourth impedance elements are all resistor having the same resistance value and the fifth and sixth impedance elements are set as capacitor, and thereby, the input impedance becomes negative capacitance.

DESCRIPTION OF THE PREFERRED EMBODIMENTS

Figure 1:
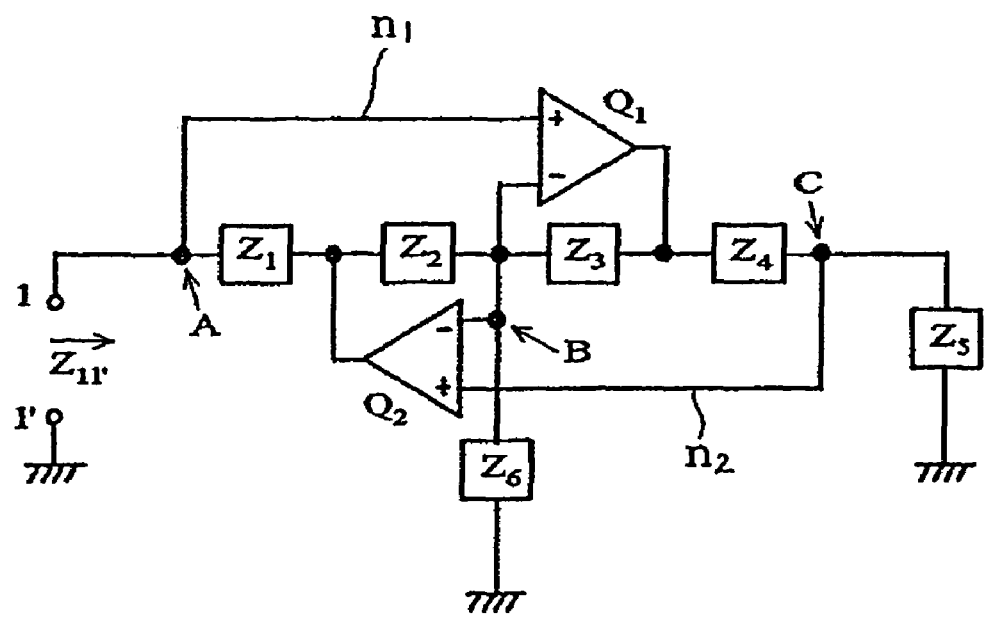
FIG. 1 is a circuit diagram showing the basic configuration of a negative impedance converter of the present invention.

FIG. 1 shows the basic circuit configuration of a negative impedance converter of the present invention. In FIG. 1, $Z_1$ to $Z_4$ denote first to fourth impedance elements, respectively, and $Z_5$ denotes a fifth impedance element functioning as a load. $Q_1$ and $Q_2$ denote operational amplifier circuits. Four, that is, first to fourth impedance elements $Z_1$ to $Z_4$ are connected in series, and two operational amplifier circuits $Q_1$ and $Q_2$ are connected to form negative feedback loops $n_1$ and $n_2$ with respect to these impedance elements $Z_1$ to $Z_4$. $Z_6$ is a sixth impedance element, which is connected between the point B and ground.

Three points connected with input terminals of two operational amplifier circuits $Q_1$ and $Q_2$ are set as A, B and C with respect to these impedance elements $Z_1$ to $Z_4$. By doing so, three points as A, B and C operate at the approximately same potential because two operational amplifier circuits $Q_1$ and $Q_2$ are connected to form negative feedback loops $n_1$ and $n_2$ as described above. Thus, these three points are regarded as being virtually connected. As illustrated in FIG. 1, the sixth impedance element $Z_6$ is connected between the point B and the ground, and the value is set as $Z_5 > Z_6$. By doing so, current flowing through the impedance element $Z_6$ is not only supplied via the impedance element $Z_5$, but also sucked from an external circuit (not shown) connected to input terminals 1 and 1'. Therefore, the input impedance $Z_{11'}$ has negative polarity.

Figure 2:
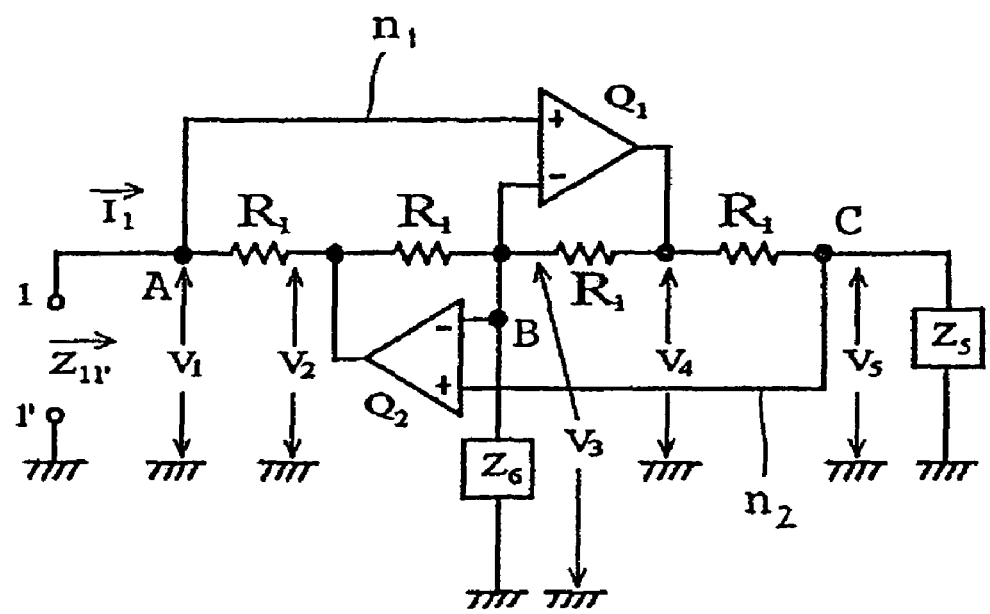
FIG. 2 is a circuit diagram to explain the operation principles of a negative impedance converter of the present invention.

In the following description, the operation principles will be explained in detail with reference to FIG. 2. In FIG. 2, impedance elements $Z_1$ to $Z_4$ are all set as the same resistor $R_1$.

In the circuit shown in FIG. 2, the following four equations (5) to (8) are given.

$$\frac{1}{I_1} = \frac{R_1}{V_1 - V_2} \quad (5)$$

$$V_1 = V_3 = V_5 \quad (6)$$

$$V_3 = (V_2 + V_4) \frac{Z_6}{R_1 + 2Z_6} \quad (7)$$

$$V_5 = V_4 \frac{Z_5}{R_1 + Z_5} \quad (8)$$

From the foregoing four equations (5) to (8), input impedance $Z_{11'}$, that is, $f_1/I_1$ can be found. Thus, the input impedance $Z_{11'}$ is expressed by the following equation (9).

$$Z_{11'} = \frac{V_1}{I_1} = \frac{Z_5 Z_6}{Z_6 - Z_5} \quad (9)$$

Therefore, the input impedance $Z_{11'}$ is determined by only $Z_5$ and $Z_6$.

From the foregoing explanation, the following matters 1 to 3 are given.

1: When $Z_5 = R_5$, $Z_6 = R_6$, $$Z_{11'} = \frac{R_5 R_6}{R_6 - R_5};$$

therefore, when $R_5 > R_6$, negative resistor is obtained.

2: When $Z_5 = sL_5$, $Z_6 = sL_6$, $$Z_{11'} = \frac{sL_5 L_6}{L_6 - L_5};$$

therefore, when $L_5 > L_6$, negative inductor is obtained.

3: When $$Z_5 = \frac{1}{sC_5}, Z_6 = \frac{1}{sC_6}, Z_{11'} = \frac{\frac{1}{s^2 C_5 C_6}}{\frac{1}{sC_6} - \frac{1}{sC_5}} = \frac{1}{s(C_5 - C_6)};$$

therefore, when $C_6 > C_5$, negative capacitor is obtained.

Figure 3:
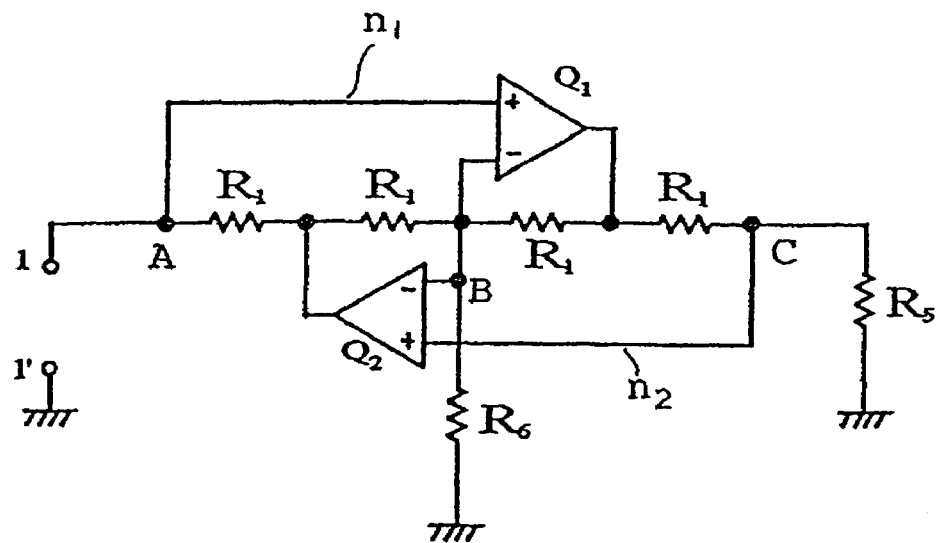
FIG. 3 is a circuit diagram showing the configuration of a negative impedance converter according to one embodiment of the present invention.
Figure 4:
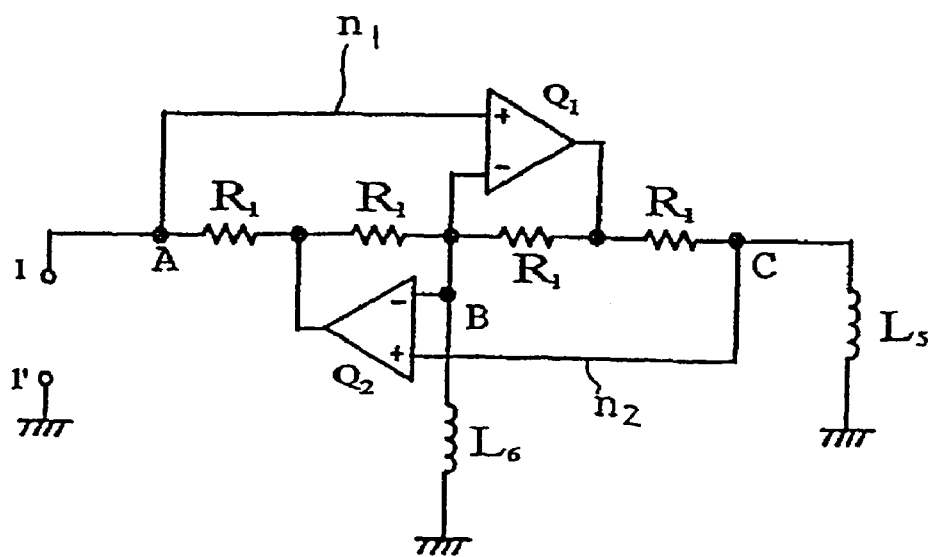
FIG. 4 is a circuit diagram showing the configuration of a negative impedance converter according to another embodiment of the present invention.
Figure 5:
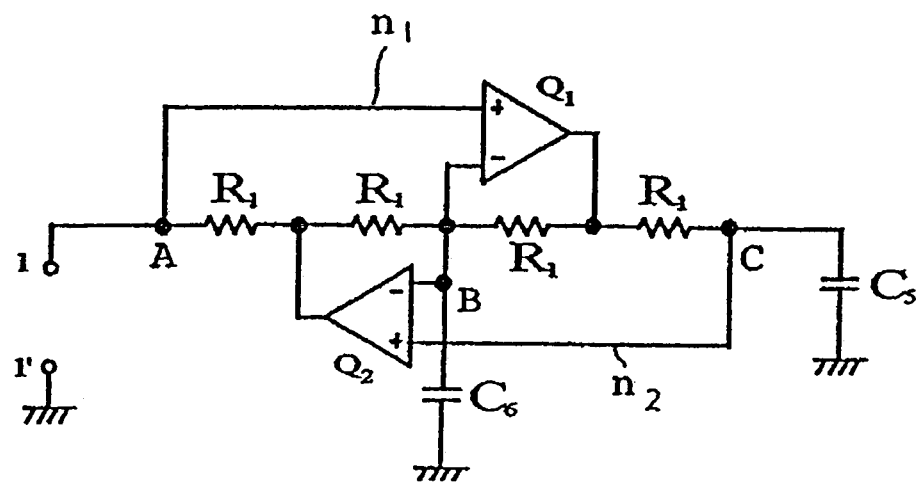
FIG. 5 is a circuit diagram showing the configuration of a negative impedance converter according to another embodiment of the present invention.

FIG. 3 to FIG. 5 shows each embodiment of the present invention.

FIG. 3 shows a circuit for obtaining negative resistance as the input impedance $Z_{11'}$. As described above, $R_5 > R_6$ is set, and thereby, negative resistance of input impedance (input resistance) $Z_{11'} = -R_5 R_6/(R_5 - R_6)$.

FIG. 4 shows a circuit for obtaining negative inductance as the input inductance. As described above, $L_5 > L_6$ is set, and thereby, input impedance $Z_{11'} = s^2 L_5 L_6/(L_6 - L_5)$; therefore, negative inductance of $-L_5 L_6/(L_6 - L_5)$ is obtained as the input inductance.

FIG. 5 shows a circuit for obtaining negative capacitance as the input capacitance. As described above, $C_6 > C_5$ is set, and thereby, input impedance $Z_{11'} = 1/s(C_5 - C_6)$; therefore, negative capacitance of $-(C_6 - C_5)$ is obtained as the input capacitance.

As seen from the foregoing explanation, it is possible to convert positive resistance, inductor and capacitor into negative resistance, inductor and capacitor using the generalized impedance converter.

Figure 6:
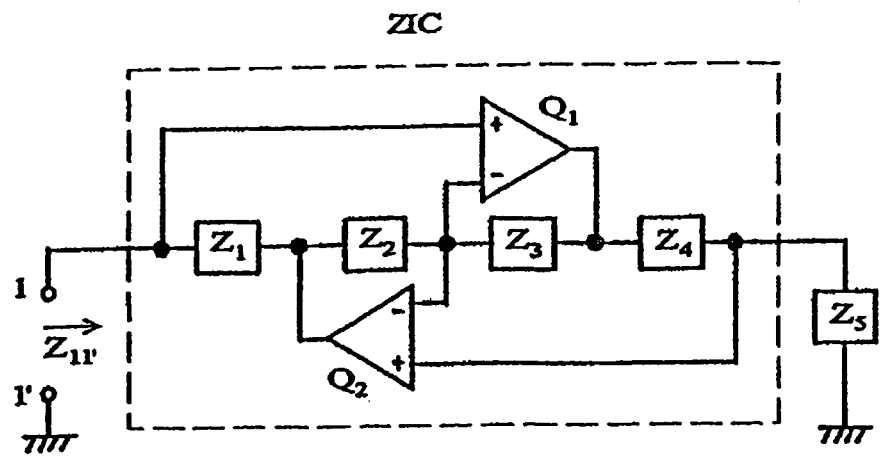
FIG. 6 is a circuit diagram showing the configuration of a conventional generalized impedance converter.

The generalized impedance converter of FIG. 6 used as the base of the present invention has the following configuration. More specifically, two terminations (i.e., points A and B in FIG. 1) of four serial-connected impedance elements $Z_1$ to $Z_4$ are connected to (+) input terminals of two operational amplifiers $Q_1$ and $Q_2$. In addition, the central connection point (i.e., point B in FIG. 1) of the impedance elements $Z_1$ to $Z_4$ is connected to (−) input terminals of two operational amplifiers $Q_1$ and $Q_2$.

The present invention presumes that the circuit configuration described above is used. However, the present invention has no limited requirement as to whether any of two (+) and (−) input terminals of two operational amplifiers $Q_1$ and $Q_2$ should be connected to the terminations or the central connection point. The reason is because the conclusion has no change even if the connection polarity of the input terminal is plus or minus so long as two operational amplifiers $Q_1$ and $Q_2$ has open loop gain in some degree and the foregoing equation (6) is established.

As is evident from the foregoing description, according to the present invention, it is possible to make the following conversion, which has not been made so far by the generalized impedance converter. One is conversion from positive resistor into negative resistor. Another is conversion from positive inductor into negative inductor. Another is conversion from positive capacitor into negative capacitor. Therefore, it is possible to largely widen the available range of the generalized impedance converter.

What is claimed is:

1. A negative impedance converter comprising:

a four series-connected first to fourth impedance elements; and two operational amplifier circuits having input and output connected to form negative feedback loop with respect to the first to fourth impedance elements, a sixth impedance element being connected between the central connection point of the first to fourth impedance elements and two operational amplifier circuits and the ground, a value of the sixth impedance element being set smaller than a value of a fifth impedance element so that the input impedance becomes negative, the fifth impedance element functioning as a load connected to the termination of the first to fourth impedance elements.

2. The negative impedance converter according to claim 1, wherein the first to sixth impedance elements are all resistor, and the value of the first to fourth resistance values are set to the same so that the input impedance becomes negative resistance.

3. The negative impedance converter according to claim 1, wherein the first to fourth impedance elements are all resistor having the same resistance value, and the fifth and sixth impedance elements are set as inductor so that the input impedance becomes negative inductance.

4. The negative impedance converter according to claim 1, wherein the first to fourth impedance elements are all resistor having the same resistance value, and the fifth and sixth impedance elements are set as capacitor so that the input impedance becomes negative capacitance.

* * * * *